(12) United States Patent
Kobayashi et al.

(10) Patent No.: US 7,405,933 B2
(45) Date of Patent: Jul. 29, 2008

(54) COOLING DEVICE, SUBSTRATE, AND ELECTRONIC EQUIPMENT

(75) Inventors: Sonomasa Kobayashi, Kawasaki (JP); Kaigo Tanaka, Kawasaki (JP); Masaki Iwata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/266,591

(22) Filed: Nov. 4, 2005

(65) Prior Publication Data

US 2006/0133048 A1 Jun. 22, 2006

Related U.S. Application Data

(63) Continuation of application No. PCT/JP03/05686, filed on May 7, 2003.

(51) Int. Cl.
*H05K 7/20* (2006.01)
*F28F 7/00* (2006.01)

(52) U.S. Cl. .............. 361/695; 361/719; 361/720; 257/707; 257/713

(58) Field of Classification Search ........ 361/695, 361/717–720; 257/706, 707, 713, 721
See application file for complete search history.

(56) References Cited

U.S. PATENT DOCUMENTS

| | | | | |
|---|---|---|---|---|
| 4,621,304 A | * | 11/1986 | Oogaki et al. | 361/720 |
| 5,582,506 A | * | 12/1996 | Hong | 415/177 |
| 5,594,623 A | * | 1/1997 | Schwegler | 361/697 |
| 5,630,469 A | * | 5/1997 | Butterbaugh et al. | 165/80.3 |
| 5,664,624 A | * | 9/1997 | Tsai et al. | 165/80.3 |
| 5,854,738 A | * | 12/1998 | Bowler | 361/695 |
| 5,940,269 A | * | 8/1999 | Ko et al. | 361/697 |
| 6,179,046 B1 | * | 1/2001 | Hwang et al. | 165/80.3 |
| 6,222,731 B1 | * | 4/2001 | Katsui | 361/697 |
| 6,227,286 B1 | | 5/2001 | Katsui | |
| 6,263,957 B1 | * | 7/2001 | Chen et al. | 165/80.4 |
| 6,345,664 B1 | | 2/2002 | Katsui | |
| 6,348,748 B1 | * | 2/2002 | Yamamoto | 310/62 |
| 6,460,608 B1 | | 10/2002 | Katsui | |
| 6,672,374 B1 | * | 1/2004 | Lin | 165/121 |
| 6,765,794 B1 | * | 7/2004 | Inoue | 361/695 |
| 2002/0001180 A1 | | 1/2002 | Kawamura | |

FOREIGN PATENT DOCUMENTS

| | | |
|---|---|---|
| EP | 0 860 875 A2 | 8/1998 |
| EP | 860875 A | 8/1998 |
| JP | 10-011174 A | 1/1998 |
| JP | 11-045967 A | 2/1999 |
| JP | 11-194859 A | 7/1999 |
| JP | 11-312770 A | 11/1999 |

(Continued)

*Primary Examiner*—Anatoly Vortman
(74) *Attorney, Agent, or Firm*—Arent Fox LLP

(57) ABSTRACT

A cooling device for cooling electronic components mounted on a substrate, comprising a radiating member having a pair of mounting plates formed of a conductive sheet metal member in generally channel shape in cross section and positioned parallel with each other and a connection plate for connecting the pair of mounting plates to each other and a cooling fan mounted on one of the mounting plates of the radiating member, wherein the other of the mounting plates of the radiating member is formed so as to be mountable on the substrate in an abutting state thereof on the electronic components mounted on the substrate.

20 Claims, 21 Drawing Sheets

FOREIGN PATENT DOCUMENTS

| | | |
|---|---|---|
| JP | 11-354701 A | 12/1999 |
| JP | 2000-151166 A | 5/2000 |
| JP | 2000-227822 A | 8/2000 |
| JP | 2001-014067 A | 1/2001 |
| JP | 2002-134973 | 10/2002 |
| KR | 1998-071649 | 10/1998 |
| TW | 11-328829 | 3/1998 |
| TW | 11-450381 | 8/2001 |
| TW | 11-456761 | 9/2001 |
| TW | 11-461698 | 10/2001 |
| TW | 11-493858 | 7/2002 |

\* cited by examiner

COOLING DEVICE, SUBSTRATE, AND ELECTRONIC EQUIPMENT

CROSS-REFERENCE TO RELATED APPLICATION

This is a continuation of Application PCT/JP2003/005686, filed on May 7, 2003, now pending, the contents of which are herein wholly incorporated by reference.

BACKGROUND OF THE INVENTION

1. Technical Field

The present invention relates to a cooling device, a substrate, and electronic equipment.

2. Background Art

Conventionally, various structures for cooling a heat generating electronic component such as a CPU have been proposed.

For example, a portable computer 1 shown in FIG. 18 is equipped with a box-shaped housing 10 formed of synthetic resin, a TCP (tape carrier package) 11 which is accommodated in the housing 10 and which is a CPU generating heat during operation, and a heat sink 12 accommodated in the housing 10 and adapted to dissipate the heat conducted from the TCP 11.

The heat sink 12 has a radiating portion 13 exposed to the exterior of the housing 10. In FIG. 18, reference symbol 10a indicates an upper housing, reference symbol 10b indicates a lower housing, and reference symbol 13a indicates an electric fan (refer to, e.g., Patent Document 1).

The portable computer 1 can efficiently dissipate the heat of the circuit element to the exterior of the housing 10, and is reasonably compatible with a reduction in the size of the housing 10.

A personal computer 2 shown in FIG. 19 has an equipment main body 15 containing a main printed circuit board 18 on which semiconductor packages 16, 17 are mounted as heat generating components, and a cooling unit 19 for cooling the heat generating components.

The cooling unit 19 has a radiating plate 20 arranged so as to oppose to the heat generating components and the main printed circuit board 18, and a cooling fan 21 mounted to the radiating plate 20.

The cooling fan 21 sucks in the air within the equipment main body through the periphery of the heat generating components and the radiating plate, and discharges it to the exterior of the equipment main body through an exhaust port 22. The cooling fan 21 is arranged such that the exhaust port 22 directly communicates with exhaust holes 23 formed in the equipment main body (refer to, e.g., Patent Document 2).

This small-sized electronic equipment can efficiently cool the heat generating components and achieve a reduction in noise.

FIG. 20 shows an information processing equipment 3, in which there is arranged a tubular radiating duct 25 formed of a material of high heat conductivity, with its ends being airtightly connected to an intake port 26a and an exhaust port 26b of a cabinet 26 through the intermediation of gaskets 27, etc.

Inside the equipment, the radiating duct 25 is arranged so as to be in contact with heat generating components 28 and by forming an external air flow inside the radiating duct 25 by using a fan motor 29 or the like, heat radiation from these components is realized, and isolation from the external air is possible, thus achieving an enhancement in waterproof and dustproof performance (refer to, e.g., Patent Document 3).

In the information processing equipment 3, it is possible to cool the heat generating components 28 inside the equipment while achieving an enhancement in dustproof and waterproof performance, so that it is applicable to an information processing equipment that is often used outdoors.

Further, FIG. 21 shows an electronic equipment 4, which has a cooling unit 30. In the cooling unit 30, heat is transferred to a heat sink 34 by an endothermic plate 32 and a heat pipe 33, and the heat sink 34 is heated through this heat transfer.

The heat sink 34 thus heated receives an air flow formed by a cooling fan 35 inclined by a fan support portion 34a thereof to be thereby forcibly cooled, and the air warmed through this forced cooling is guided substantially in the horizontal direction by an exhaust passage 34e before being discharged to the exterior of the housing through an exhaust port provided in the housing.

Through this exhaust, it is possible to prevent local heating of a portion situated above the CPU mounted to the endothermic plate 32, with the result that it is possible to prevent an unpleasant feeling from being given to the fingertips of the operator (refer to, e.g., Patent Document 4).

[Patent Document 1]
JP 10-11174 A
[Patent Document 2]
JP 2001-14067 A
[Patent Document 3].
JP 11-194859 A
[Patent Document 4]
JP 2000-227822 A However, in the conventional portable computer 1 shown in FIG. 18, the TCP 11 and the heat sink 12 are at positions spaced apart from each other, so that when a CPU of large heat generation amount as used in present-day notebook personal computers is used, there is a fear of this CPU not being cooled to a sufficient degree.

In the personal computer 2 shown in FIG. 19, it is necessary to cut out the portion where the cooling fan 21 of the main printed circuit board 18 is to be installed, which leads to a decrease in the mounting area of the main printed circuit board 18.

In the information processing equipment 3 shown in FIG. 20, the heat generating parts 28 are cooled by the air passing through the interior of the heat radiating duct 25, resulting in a poor cooling efficiency.

In the electronic equipment 4 shown in FIG. 21, it is possible to effect cooling by using the axial flow cooling fan 35 of low unit cost while achieving a reduction in installation height. However, the CPU and the cooling fan 35 are mounted on the same surface of the substrate, which leads to a problem in that the mounting area of the substrate is reduced.

SUMMARY OF THE INVENTION

The present invention has been made in view of the above problems in the prior art. It is an object of the present invention to provide a cooling device, a substrate, and electronic equipment which do not involve a reduction in substrate mounting area and with which it is possible to cool heat generating electronic components to a sufficient degree.

To achieve the above object, the present invention adopts the following elements.

In other words, the present invention relates to a cooling device for cooling electronic components mounted on a substrate, including: a radiating member having a pair of mounting plates formed of a heat conductive sheet metal member in generally channel shape in cross section and positioned substantially parallel with each other and a connection plate for connecting the pair of mounting plates to each other; and a cooling fan mounted on one of the mounting plates of the radiating member, in which the other of the mounting plates of the radiating member is formed so as to be mountable on the substrate while in contact with the electronic components mounted on the substrate.

In the present invention, the heat generated in the electronic components is conducted to the mounting plate on which the cooling fan is mounted through one mounting plate of the radiating member and the connection plate, and cooling is effected by the cooling fan.

Here, the cooling fan is mounted on an outer surface of the mounting plate, and the mounting plate on which the cooling fan is mounted may be provided with an opening communicating with an intake port of the cooling fan.

In this case, the air in the gap between the substrate and the mounting plate on which the cooling fan is mounted is sucked by the cooling fan through the above-mentioned opening. As a result, external air flows into the gap.

Further, the substrate-side surfaces of the electronic components are cooled by the air flowing into this gap. That is, the electronic components are cooled from both sides, so that it is possible to cool the electronic components to a sufficient degree.

Further, it is possible to arrange the pair of mounting plates in alignment with each other. In this case, the air flowing into the gap from outside due to the suction by the cooling fan comes into contact with the portion of the substrate where the electronic components are mounted, so that the electronic component cooling effect is enhanced.

The present invention relates to a substrate on at least one surface of which electronic components are mounted, including: a radiating member having a pair of mounting plates formed of a heat conductive sheet metal member in generally channel shape in cross section and positioned substantially parallel with each other and a connection plate for connecting the pair of mounting plates to each other; and a cooling fan mounted on one of the mounting plates of the radiating member, in which the pair of mounting plates are arranged in such a manner that the pair of mounting plates sandwich the substrate, and in which the substrate is structured so that the other of the mounting plates of the radiating member is in contact with the electronic components, the connection plate being situated outside the region of the substrate, the cooling fan mounted on one of the mounting plates being situated on a surface different from the surface on which the electronic components are mounted.

Here, a gap may be provided between the mounting plate on which the cooling fan is mounted and the substrate.

Also, it is possible to mount electronic components in the gap. In this case, the mounting density of the substrate is increased.

Further, the pair of mounting plates of the radiating member are arranged in alignment with each other, and the cooling fan is arranged at a position opposed to the electronic components.

In this case, the air sucked into the gap by the cooling fan comes-into direct contact with the portion where the electronic components are mounted, so that the electronic component cooling effect is enhanced.

The present invention relates to an electronic equipment including a substrate on at least one surface of which electronic components are mounted, including: a radiating member having a pair of mounting plates formed of a heat conductive sheet metal member in generally channel shape in cross section and positioned substantially parallel with each other and a connection plate for connecting the pair of mounting plates to each other; and a cooling fan mounted on one of the mounting plates of the radiating member, in which the pair of mounting plates are arranged in such a manner that the pair of mounting plates sandwich the substrate, and the electronic equipment is structured so that the other of the mounting plates of the radiating member is in contact with the electronic components, the connection plate being situated outside the region of the substrate, the cooling fan mounted on one of the mounting plates being situated on a surface different from the surface on which the electronic components are mounted.

Here, a gap may be provided between the mounting plate on which the cooling fan is mounted and the substrate.

Further, an electronic component may be mounted in the gap.

Further, the pair of mounting plates of the radiating member are arranged in alignment with each other, and the cooling fan may be arranged at a position opposed to the electronic components.

It should be noted that the above-mentioned components allow combination with each other without departing from the gist of the present invention.

DETAILED DESCRIPTION OF THE INVENTION

In the following, a best mode of the present invention will be described with reference to the drawings.

Figure 1:
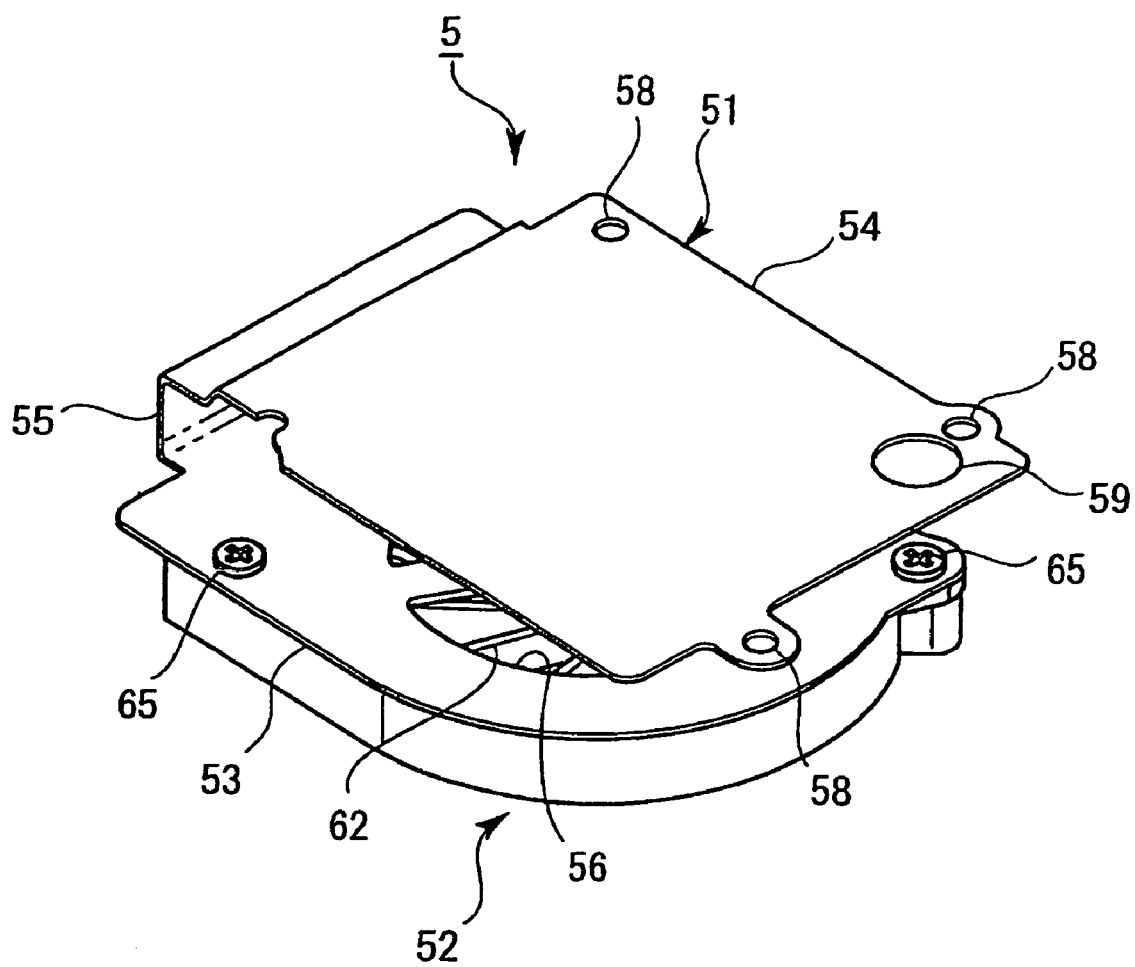
FIG. 1 is a perspective view of a cooling device according to the present invention.

FIG. 1 shows a cooling device 5 according to the present invention. The cooling device 5 is a cooling device for cooling a CPU 67 (see FIG. 10) which is an electronic component mounted on a substrate.

The cooling device 5 has a radiating member 51 formed of a heat conductive sheet metal member and a cooling fan 52.

Figure 2:
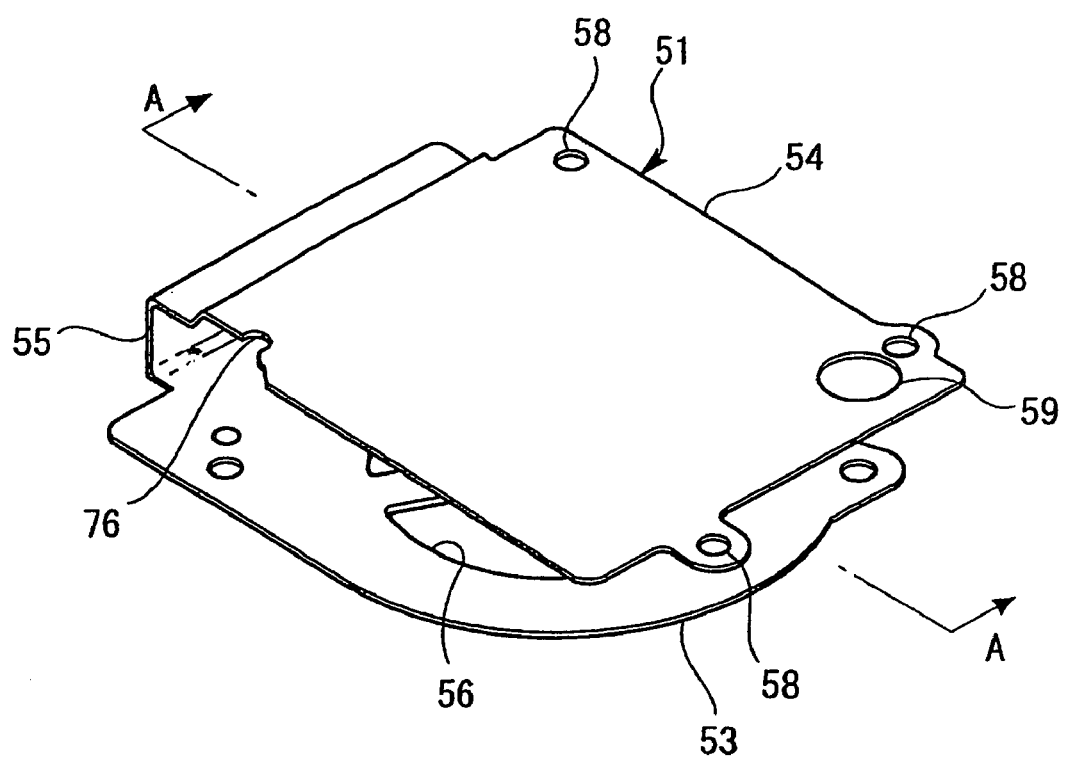
FIG. 2 is a perspective view of a radiating member according to the present invention.

As shown in FIG. 2, the radiating member 51 has a pair of first and second mounting plates 53, 54 parallel to each other and a connection plate 55 connecting the pair of first and second mounting plates 53, 54 to each other with these plates being formed integrally.

Figure 3:
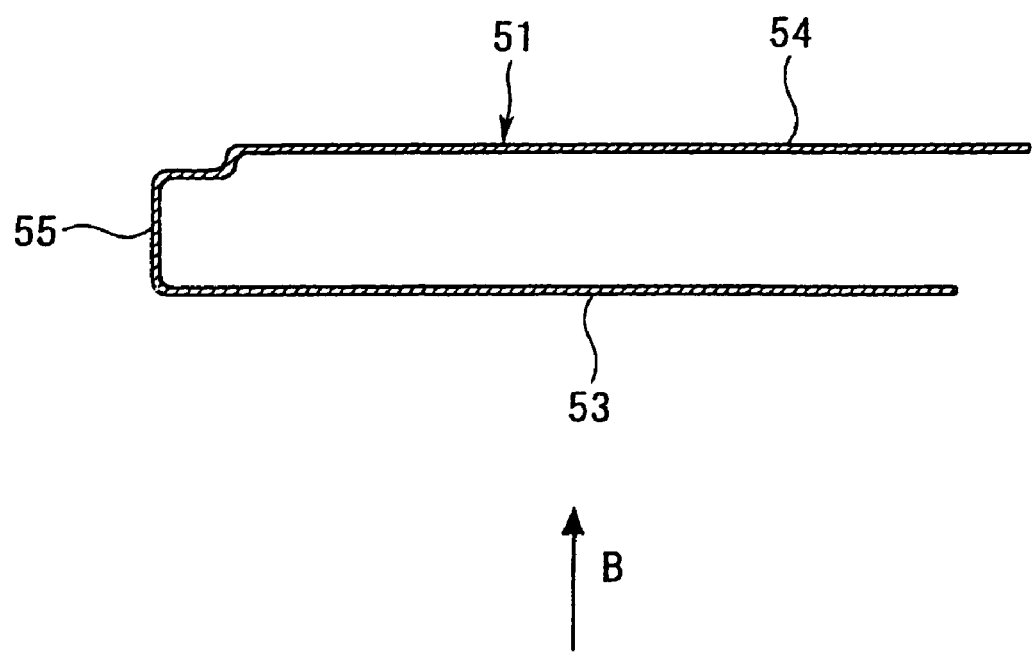
FIG. 3 is a sectional view taken along a line A-A of FIG. 2.

As shown in FIG. 3, the first and second mounting plates 53, 54 and the connection plate 55 are generally in channel shape in cross section. Further, the first and second mounting plates 53, 54 are arranged in alignment with each other.

Figure 4:
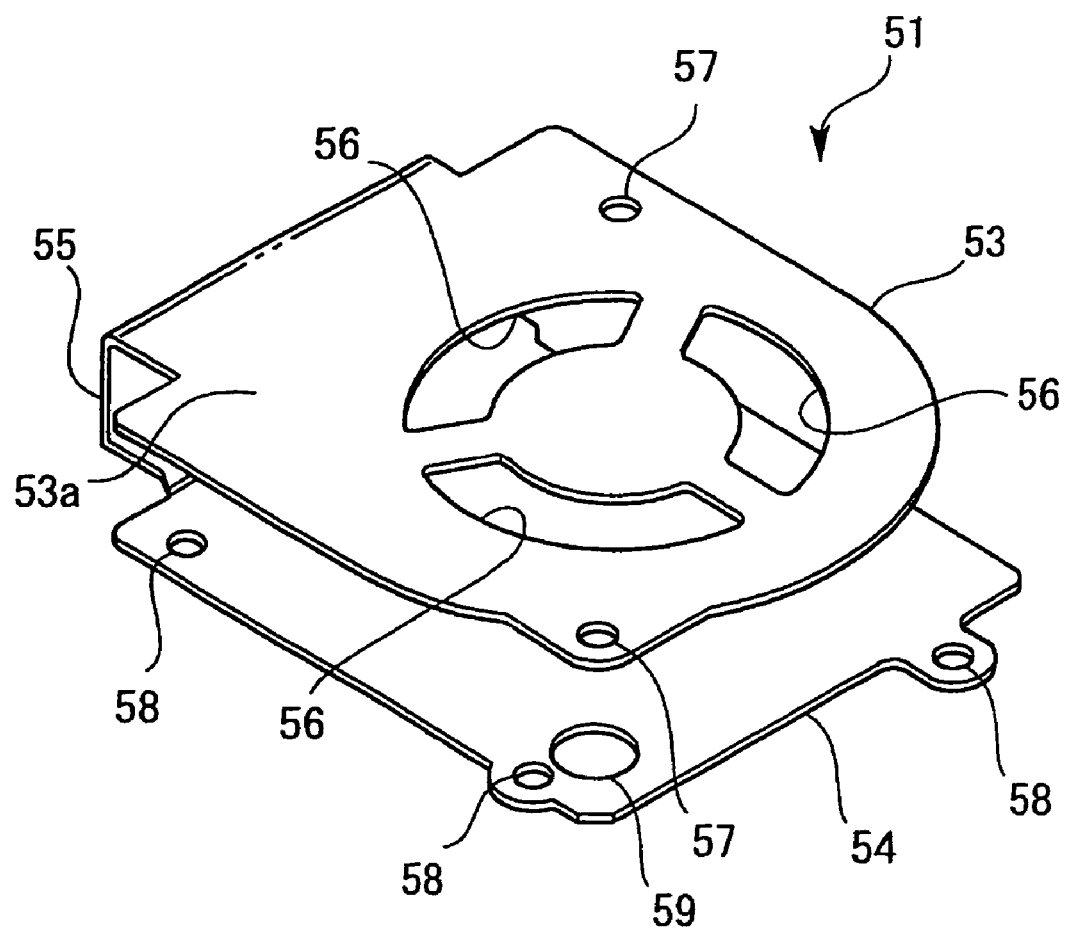
FIG. 4 is a view taken in the direction of an arrow B of FIG. 3.

As shown in FIG. 4, the first mounting plate 53 is substantially of the same size as or slightly larger than the mounting surface of the cooling fan 52 (see FIG. 1). Further, the forward end portion of the first mounting plate 53 is formed in an arcuate configuration.

The first mounting plate 53 is provided with arcuate intake ports 56 communicating with a first intake port 85 (see FIG. 6) of the cooling fan 52. The intake ports 56 share the same center.

Further, the first mounting plate 53 is provided with holes 57 for mounting the cooling fan 52.

Figure 10:
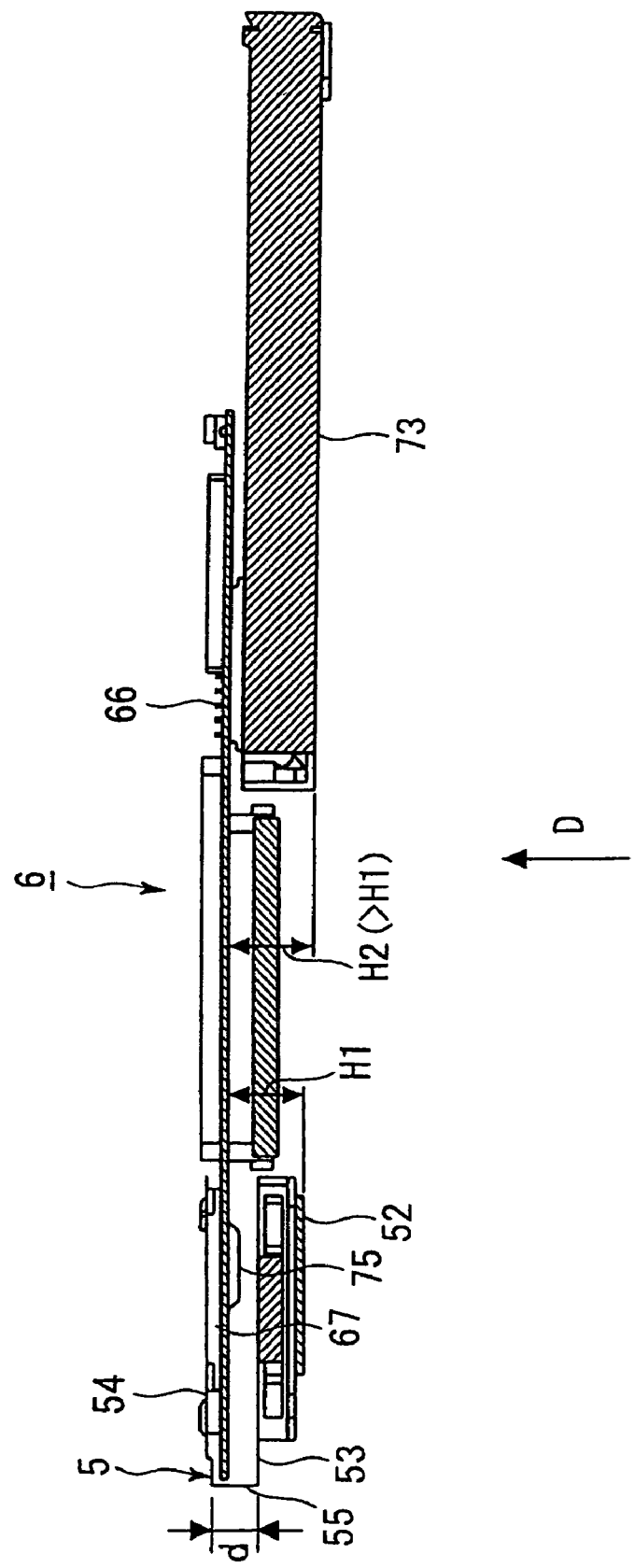
FIG. 10 is a sectional view taken along a line C-C of FIG. 9.

As shown in FIG. 2, the second mounting plate 54 is formed so as to be substantially of the same size as or slightly larger than the outer surface of a CPU 67 (see FIG. 10).

Further, the second mounting plate 54 is provided with holes 58 and a cutout 76 through which screws for mounting to a substrate 66 (see FIG. 9) are to be passed. In FIG. 2, reference numeral 59 indicates a hole through which a driver is to be passed when assembling the cooling fan 52 to the first mounting plate 53.

Figure 5:
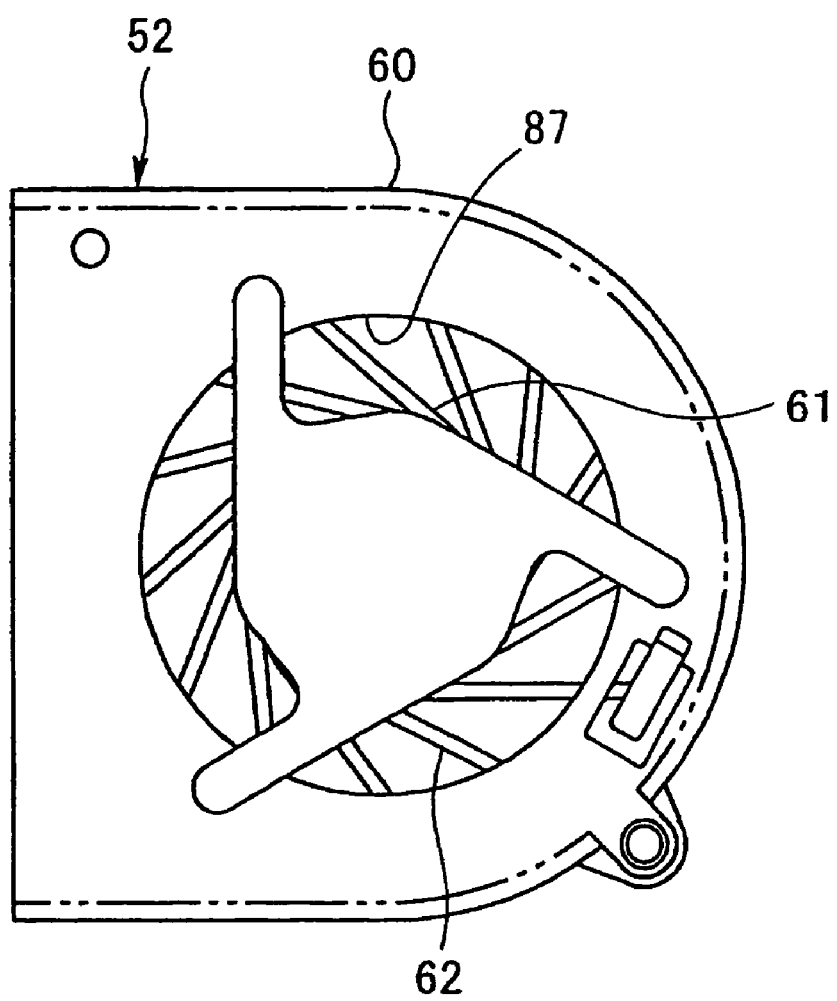
FIG. 5 is a bottom view of a cooling fan according to the present invention.

As shown in FIG. 5, the cooling fan 52 has a case 60, one end of which is semi-circular and the other end of which is rectangular, a motor 61 mounted to the case 60, and an impeller 62 mounted to the motor 61.

Figure 6:
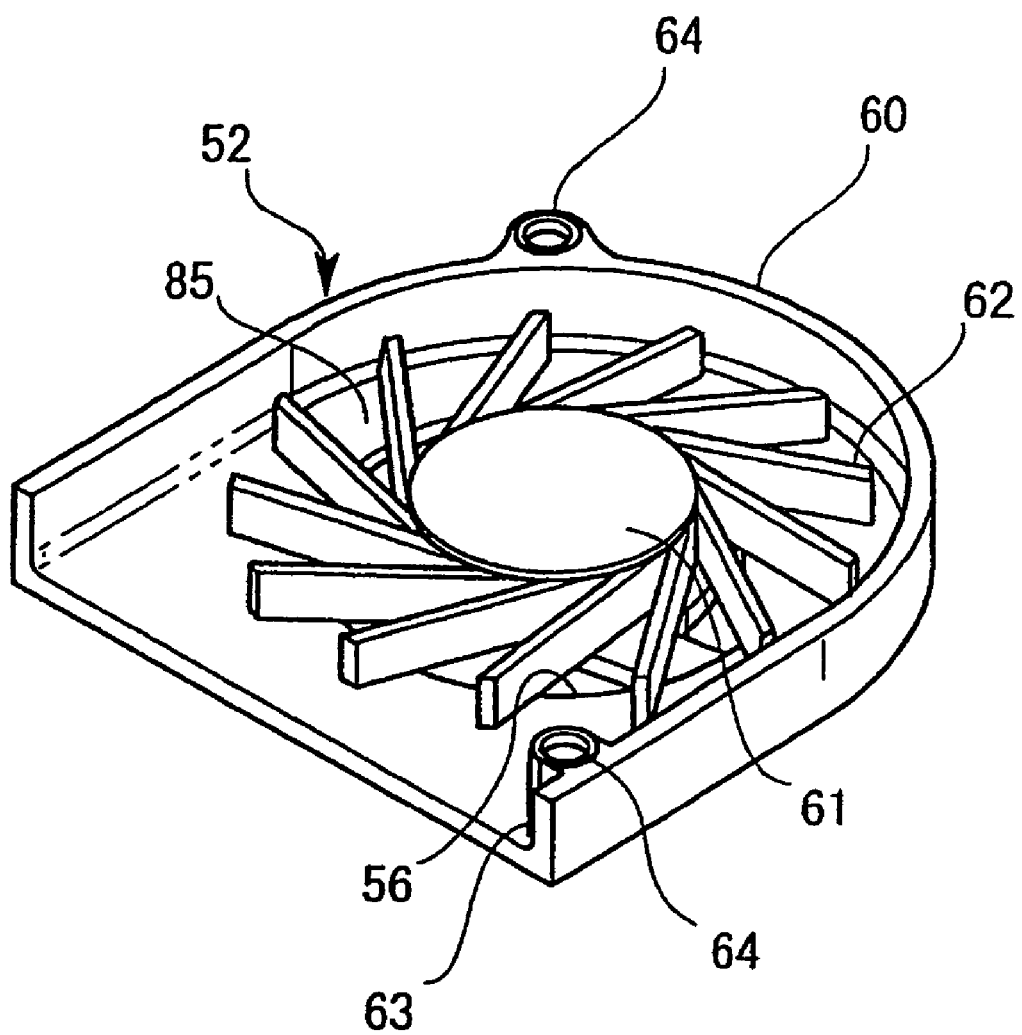
FIG. 6 is a perspective view of a cooling fan according to the present invention.

As shown in FIG. 6, the case 60 is formed in a relatively thin shape. One side of the case 60 is totally open, and is equipped with the intake port 85. Further, on the side of the case 60 opposite to the intake port 85, there are formed the arcuate intake ports 56 (see FIG. 8).

Further, at the straight line-like end of the case 60, there is provided an exhaust port 63. In the outer periphery of the case 60, there are provided screw holes 64 for mounting.

The center of the motor 61 is arranged at the center of the arcs of the intakes 56. The above-mentioned impeller 62 is mounted to the central shaft of the motor 61. The impeller 62 rotates over the intake ports 56.

When the impeller 62 rotates, air is sucked into the case 60 through the intake ports 85, 56 on both sides of the case 60, and is discharged through the exhaust port 63.

Figure 7:
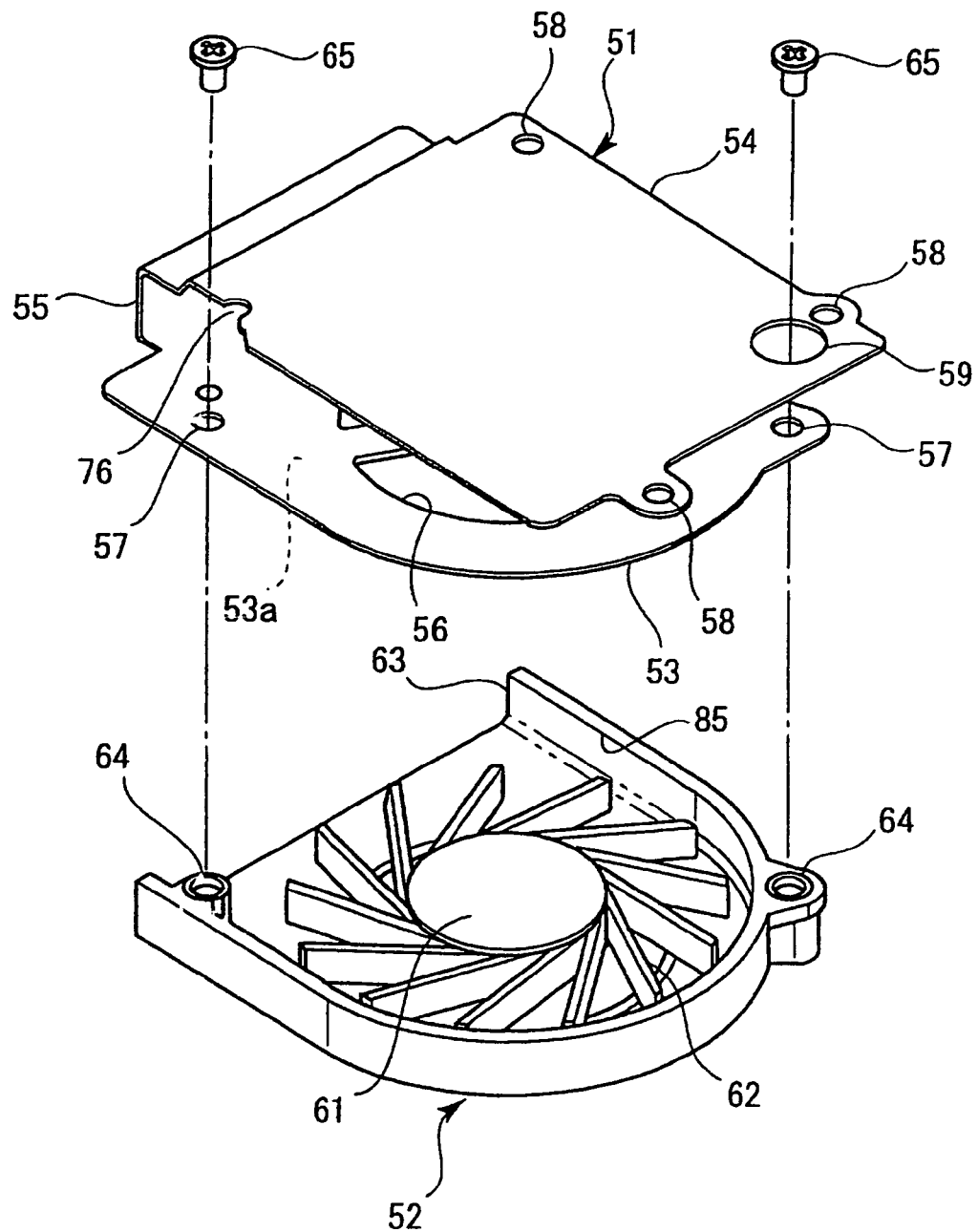
FIG. 7 is an exploded perspective view of a cooling device according to the present invention.

As shown in FIG. 7, when mounting the cooling fan 52 to the above-mentioned radiating member 51, the open intake port 85 of the cooling fan 52 is directed to the outer surface 53a of the first mounting plate 53, and the exhaust port 63 is directed to the connection plate 55.

Further, the case 60 of the cooling fan 52 is caused to abut the outer surface 53a of the first mounting plate 53, and the case 60 is fixed to the first mounting plate 53 by using screws 65.

Figure 8:
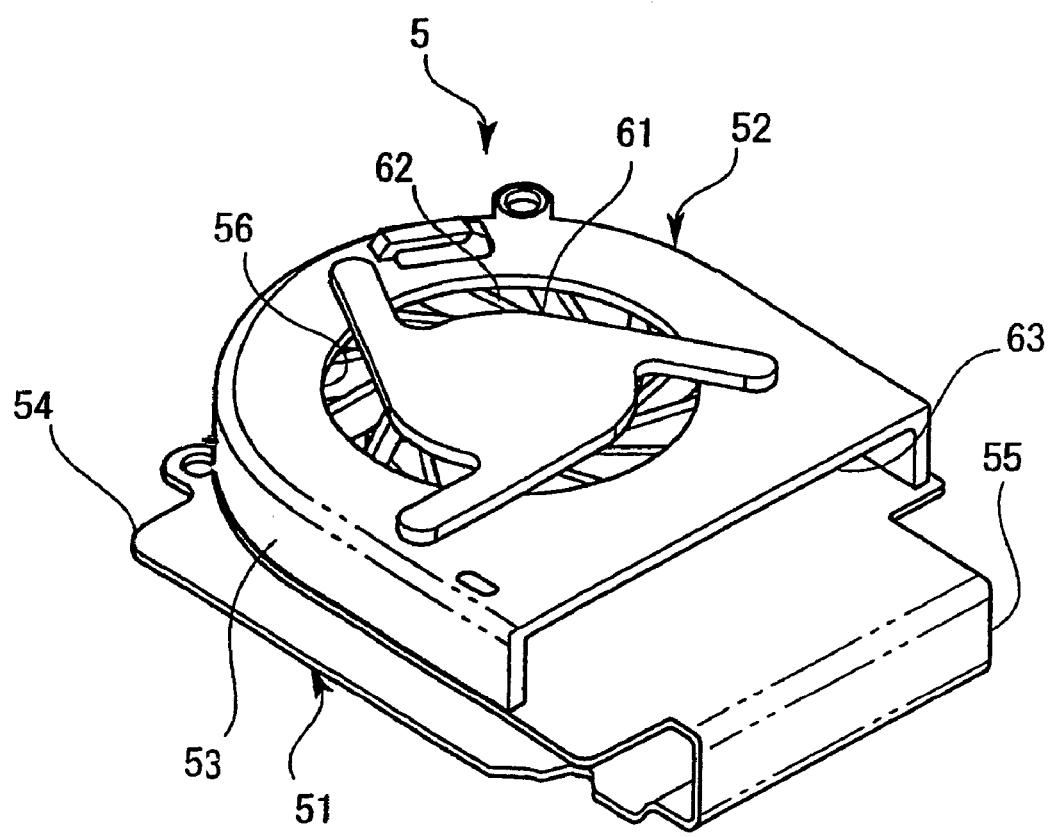
FIG. 8 is a perspective view of a cooling device according to the present invention as seen from the cooling fan side.

As a result, as shown in FIG. 8, the intake ports 56, 85 of the cooling fan 52 are open so as to be substantially parallel to the first mounting plate 53, and the exhaust port 63 is open so as to be substantially perpendicular to the first mounting plate 53.

Figure 9:
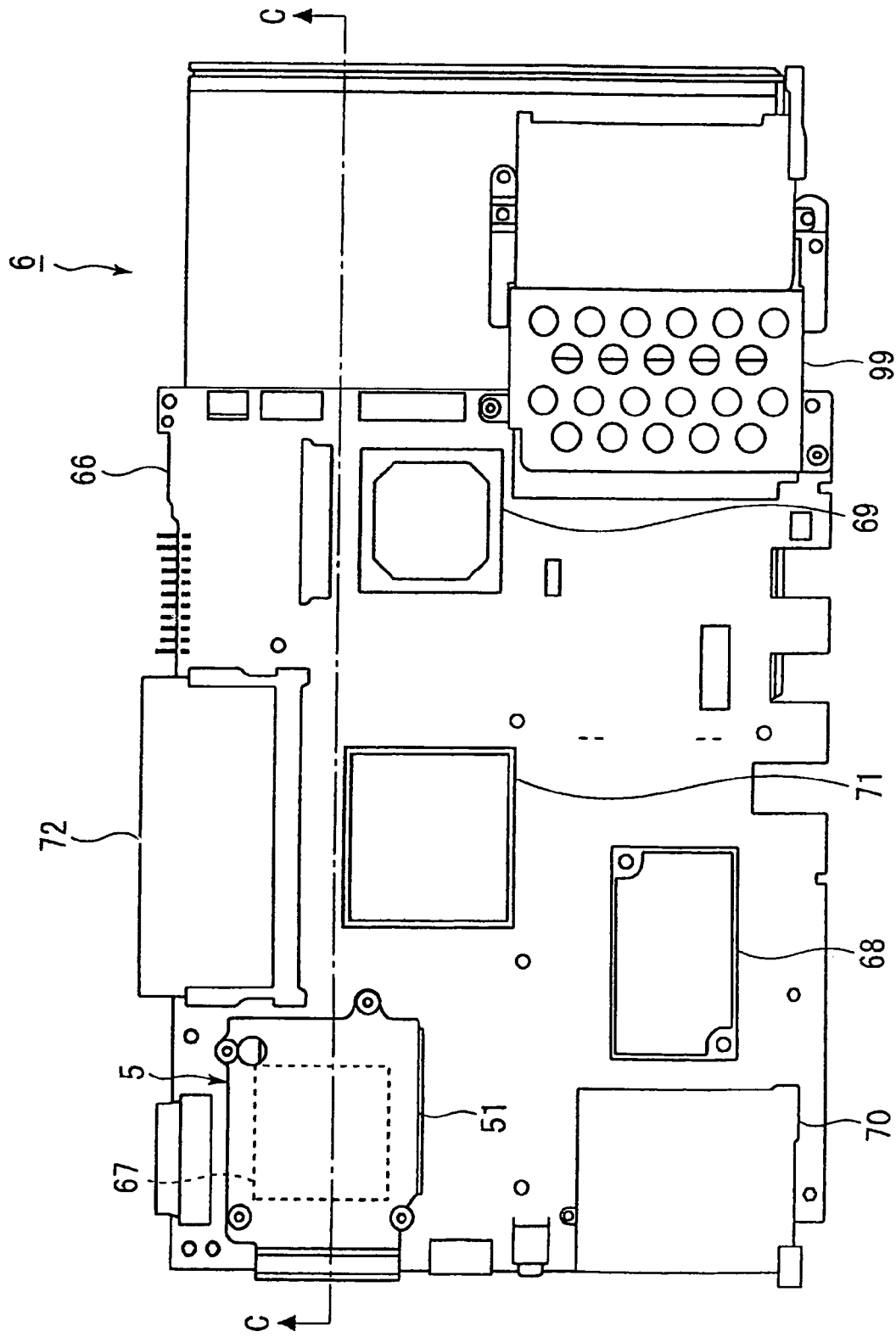
FIG. 9 is a plan view of a substrate according to the present invention.

FIG. 9 shows a main board 6 using the above cooling device 5. In the main board 6, the CPU 67 is mounted on one surface of the substrate 66. The second mounting plate 54 of the cooling device is mounted on the CPU 67. In FIG. 9, reference numerals 68 through 72 indicate electronic components, and reference numeral 99 indicates a PC card connector.

As shown in FIG. 10, the cooling device 5 is mounted so as to sandwich the CPU 67 and the substrate 66 between the first mounting plate 53 and the second mounting plate 54. A gap d is provided between the first mounting plate 53 and the substrate 66.

Figure 11:
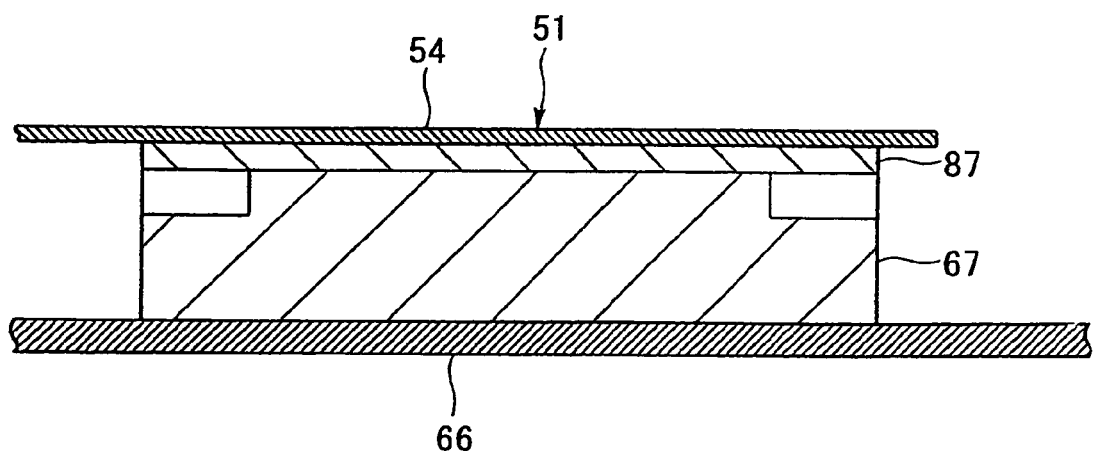
FIG. 11 is a sectional view of a radiating rubber provided between a CPU and a radiating member according to the present invention.

As shown in FIG. 11, a radiating rubber 87 is sandwiched between the CPU 67 and the second mounting plate 54. Due to the radiating rubber 87, the gap between the CPU 67 and the second mounting plate 54 is filled, making it possible to prevent air from existing between the CPU 67 and the second mounting plate 54. As a result, the heat of the CPU 67 is efficiently conducted to the second mounting plate 54.

Instead of the radiating rubber 87, it is possible to use a filler material, such as grease or silicone to fill the gap between the CPU 67 and the second mounting plate 54.

Figure 12:
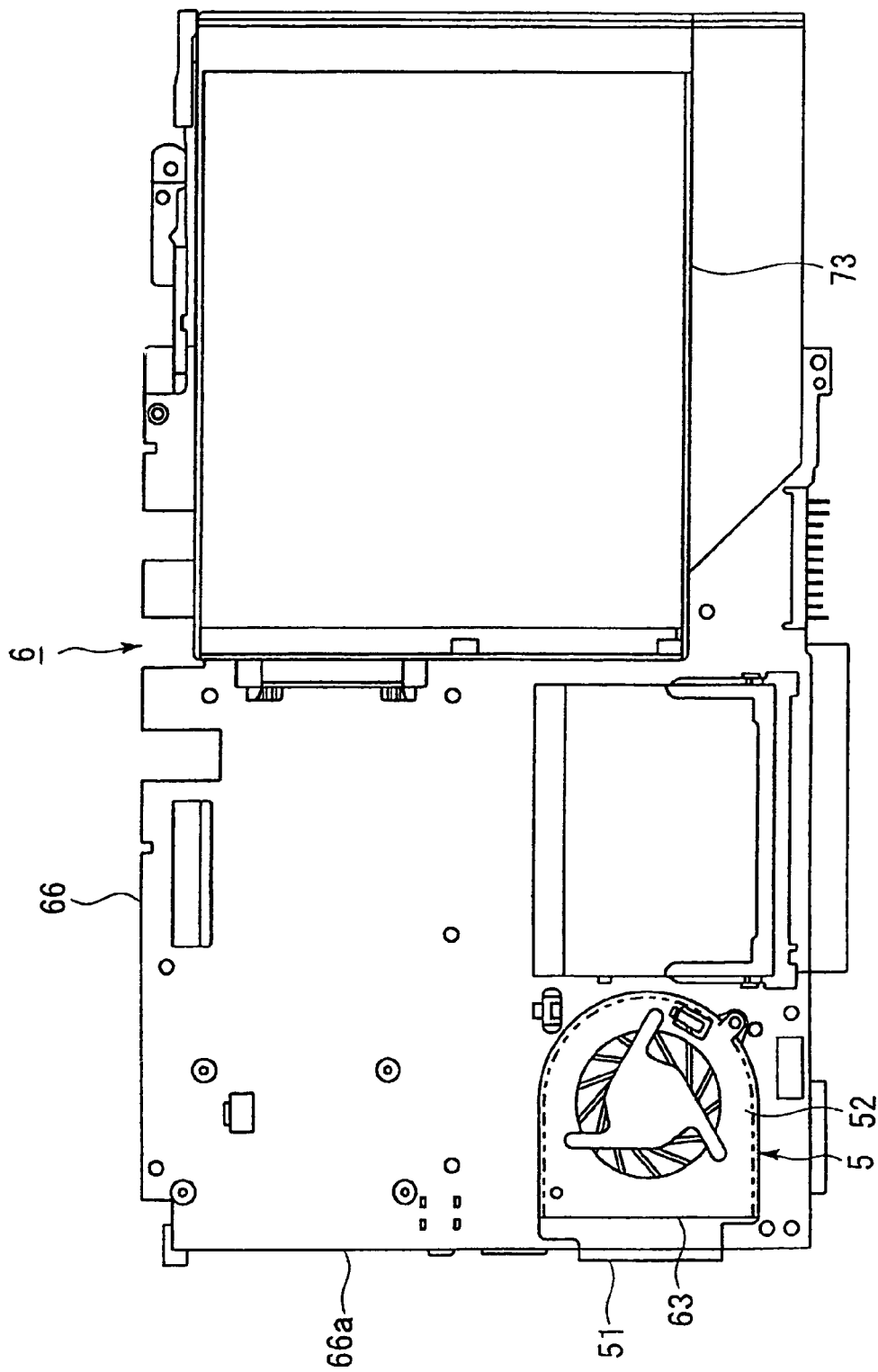
FIG. 12 is a view taken in the direction of an arrow D of FIG. 10.

As shown in FIG. 12, in the cooling fan 52, the exhaust port 63 thereof is arranged in the vicinity of an end edge 66a of the substrate 66. Due to this arrangement, the air discharged from the exhaust port 63 of the cooling fan 52 is discharged to the exterior of the substrate 66.

As shown in FIG. 10, a bay drive 73 is mounted on the cooling fan 52 side surface of the substrate 66. Here, the height of the cooling fan 52 as measured from the substrate 66 will be referred to as H1, and the height of the bay drive 73 as measured from the substrate 66 will be referred to as H2. The height H1 of the cooling fan 52 is not taller than the height H2 of the bay drive 73.

That is, if the cooling fan 52 is arranged on the side opposite to the CPU 67, the height 52 of the cooling fan 52 is accommodated by the height H2 of the bay drive 73. Thus, there is no fear of increasing the size of the main board 6 due to the mounting of the cooling device 5.

Further, in the gap d between the substrate 66 and the first mounting plate 53 of the cooling device 5, there is arranged an electronic component 75 mounted on the substrate 66. Thus, as compared with the case in which the cooling fan 52 is directly mounted to the substrate 66, the mounting density of the substrate 66 is increased.

Figure 13:
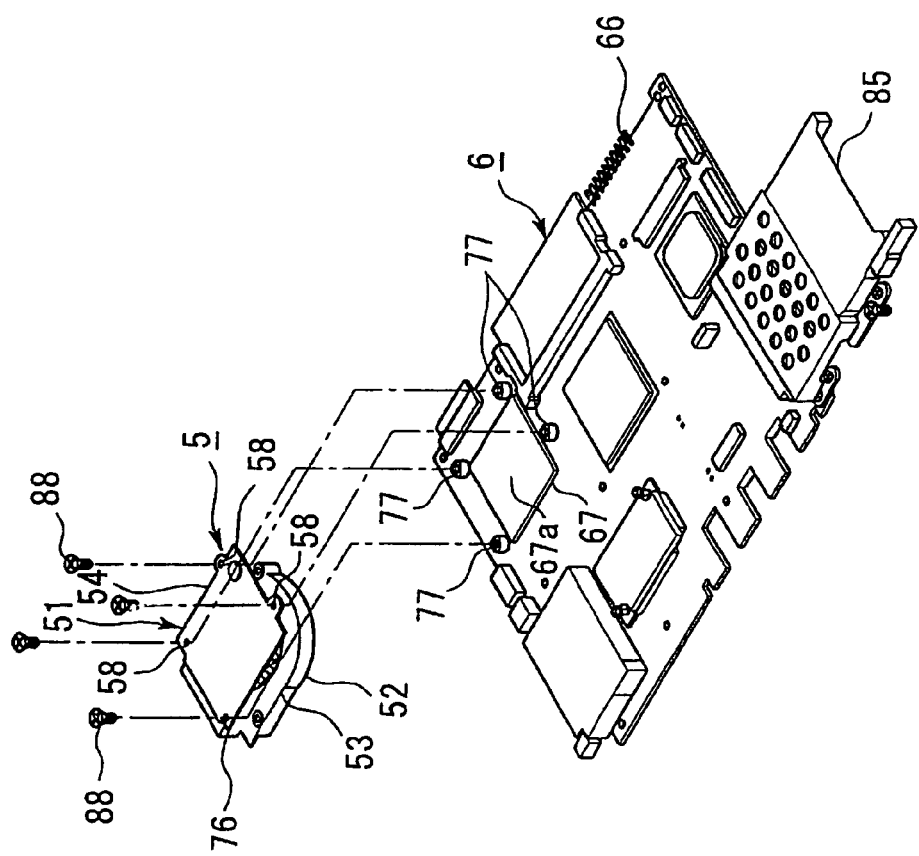
FIG. 13 is an exploded perspective view of a main board according to the present invention.

As shown in FIG. 13, when mounting the above-mentioned cooling device 5 to the substrate 66, the second mounting plate 54 of the cooling device 5 is brought into contact with the upper surface 67a of the CPU 67. Next, the holes 58 and the cutout 76 of the second mounting plate 54 are matched with screw portions 77 provided in the vicinity of the corner portions of the CPU 67. Then, screws 88 are passed through the holes 58 and the cutout 76 to be threadedly engaged with the screw portions 77.

Figure 14:
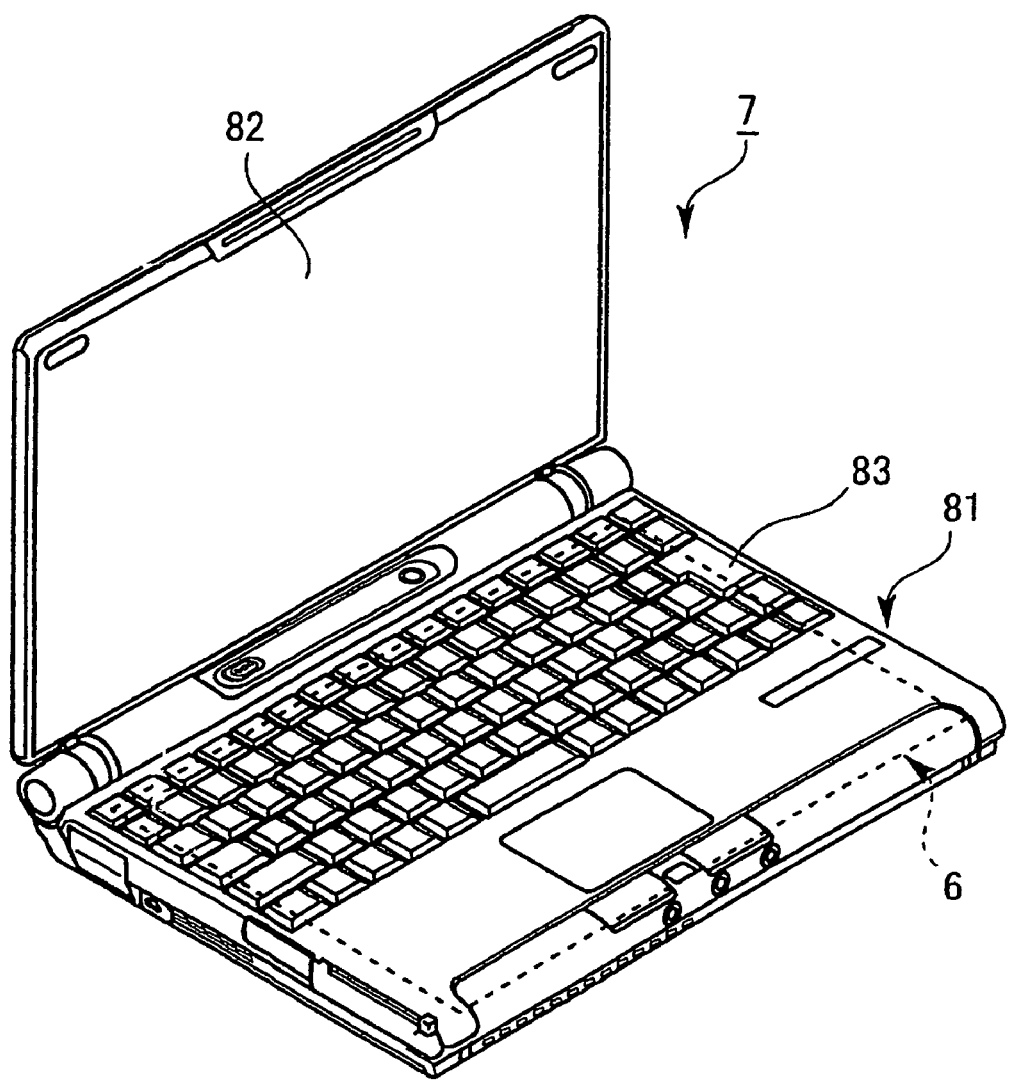
FIG. 14 is a perspective view of a notebook personal computer according to the present invention.

FIG. 14 shows a notebook personal computer 7, which is an electronic equipment using the main board 6. The notebook personal computer 7 has a main body 81 and an LCD (liquid crystal display) 82. The main body 81 is provided with a keyboard 83.

Figure 15:
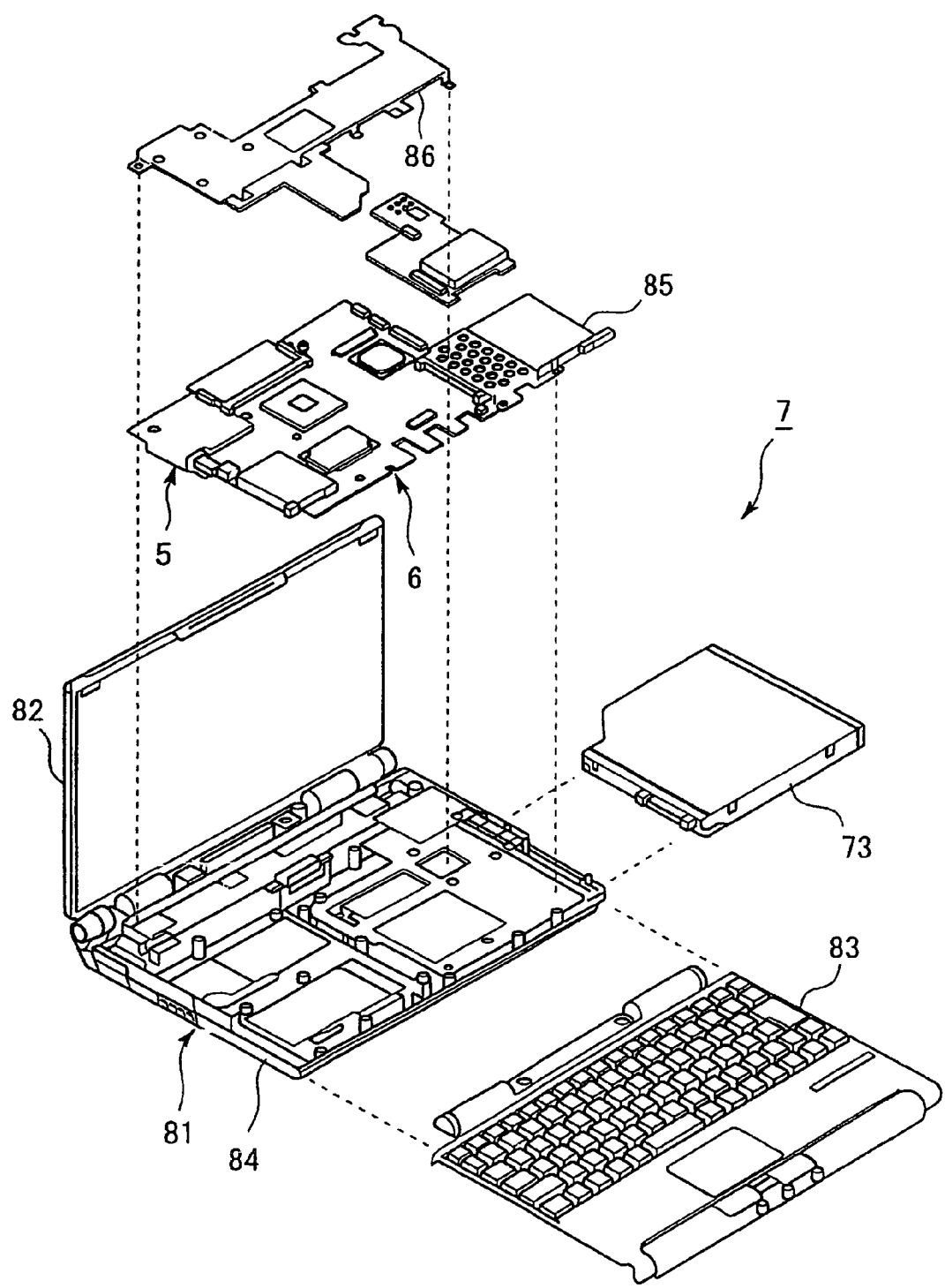
FIG. 15 is an exploded perspective view of a notebook personal computer according to the present invention.

As shown in FIG. 15, the main body 81 has a lower cover 84. The main board 6 and the bay drive 73 are accommodated in the lower cover 84. A heat sink 86 is provided on the main board 6.

In this way, in the present invention, the second mounting plate 54 of the radiating member 51 is substantially in total contact with the CPU 67. Further, a portion of the heat generated in the CPU 67 is conducted through the second mounting plate 54 and the connection plate 55 of the radiating member 51 to the first mounting plate 53, to which the cooling fan 52 is mounted, and cooling is effected by the cooling fan 52.

On the other hand, a portion of the heat generated in the CPU 67 transmits to the substrate 66. Here, air which is at room temperature is sucked from outside into the gap d between the substrate 66 and the first mounting plate 53 by the cooling fan 52.

This air comes into contact with the portion of the substrate 66 where the CPU 67 is mounted, and then flows through the intake ports 56 provided in the first mounting plate 53, the intake port 85 of the cooling fan 52, and the space inside the case 60 before being discharged through the exhaust port 63. At this time, the substrate 66 is cooled by the air flowing into the gap d from outside.

That is, in the present invention, both sides of the CPU 67 is cooled by the cooling fan 52, so that it is possible to cool the CPU 67 which is of a large heat generating amount and large size to a sufficient degree.

Further, the pair of first and second mounting plates 53, 54 of the cooling device 5 are arranged at positions in alignment with each other, so that the air sucked into the gap d from outside by the cooling fan 52 comes into contact with the portion of the substrate 66 where the CPU 67 is mounted. Thus, it is possible to reliably cool the CPU 67.

Further, in the main board 6 of the present invention, the gap d is formed between the cooling fan 52 and the substrate 66 as described above, so that it is possible to mount another electronic component 75 in this gap d. Thus, an improvement is achieved in terms of the mounting density of the substrate 66.

The present invention is suitable for a notebook personal computer 7 or the like, which has a limitation to the size of the main board 6 and which has the CPU 67 of a large heat generation amount.

Figure 16:
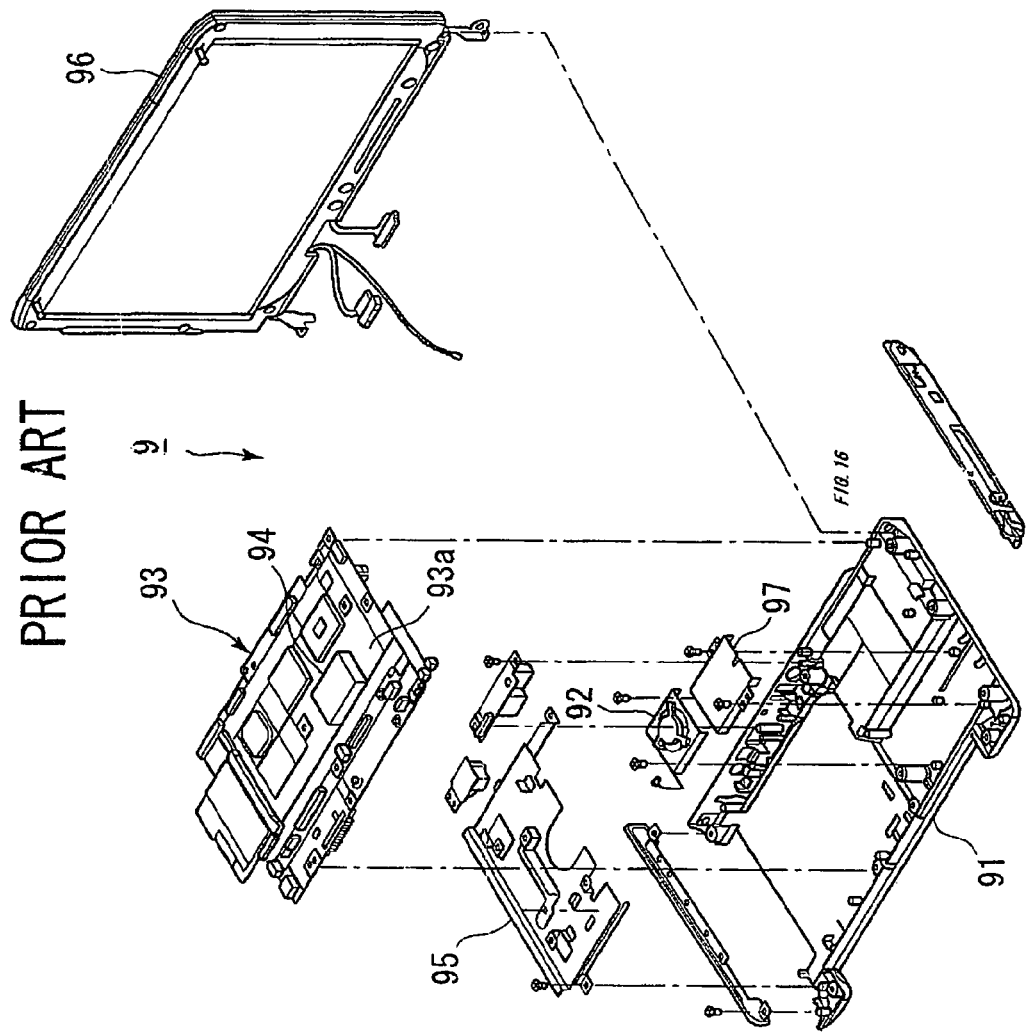
FIG. 16 is an exploded perspective view of a conventional notebook personal computer.

Here, a conventional notebook personal computer 9 shown in FIG. 16 will be considered. In the conventional notebook personal computer 9, a cooling fan 92 is mounted to a lower cover 91. A substrate 93 is arranged on the upper side (the upper side in FIG. 16) of the cooling fan 92.

In FIG. 16, reference numeral 95 indicates a heat sink, reference numeral 96 indicates an LCD, and reference numeral 97 indicates a duct.

A case will be considered in which, in the conventional notebook personal computer 9, a CPU 94 is mounted on the upper surface 93a of the substrate 93, that is, on the surface of the substrate 93 on the side opposite to the cooling fan 92.

Figure 17:
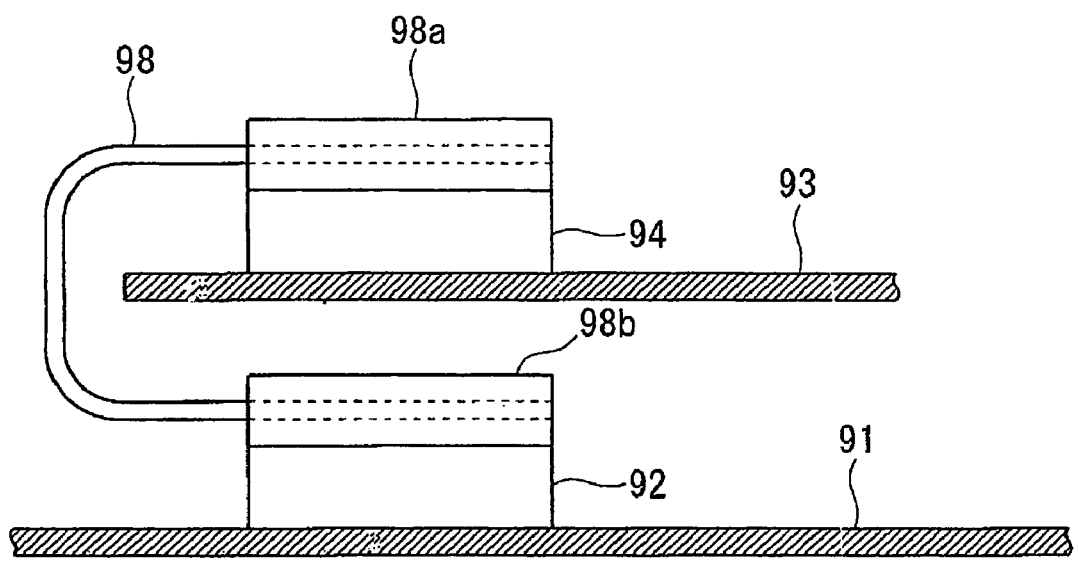
FIG. 17 is a sectional view showing a CPU and a cooling fan of a conventional notebook personal computer in a state where they are connected to each other through a heat pipe.
Figure 18:
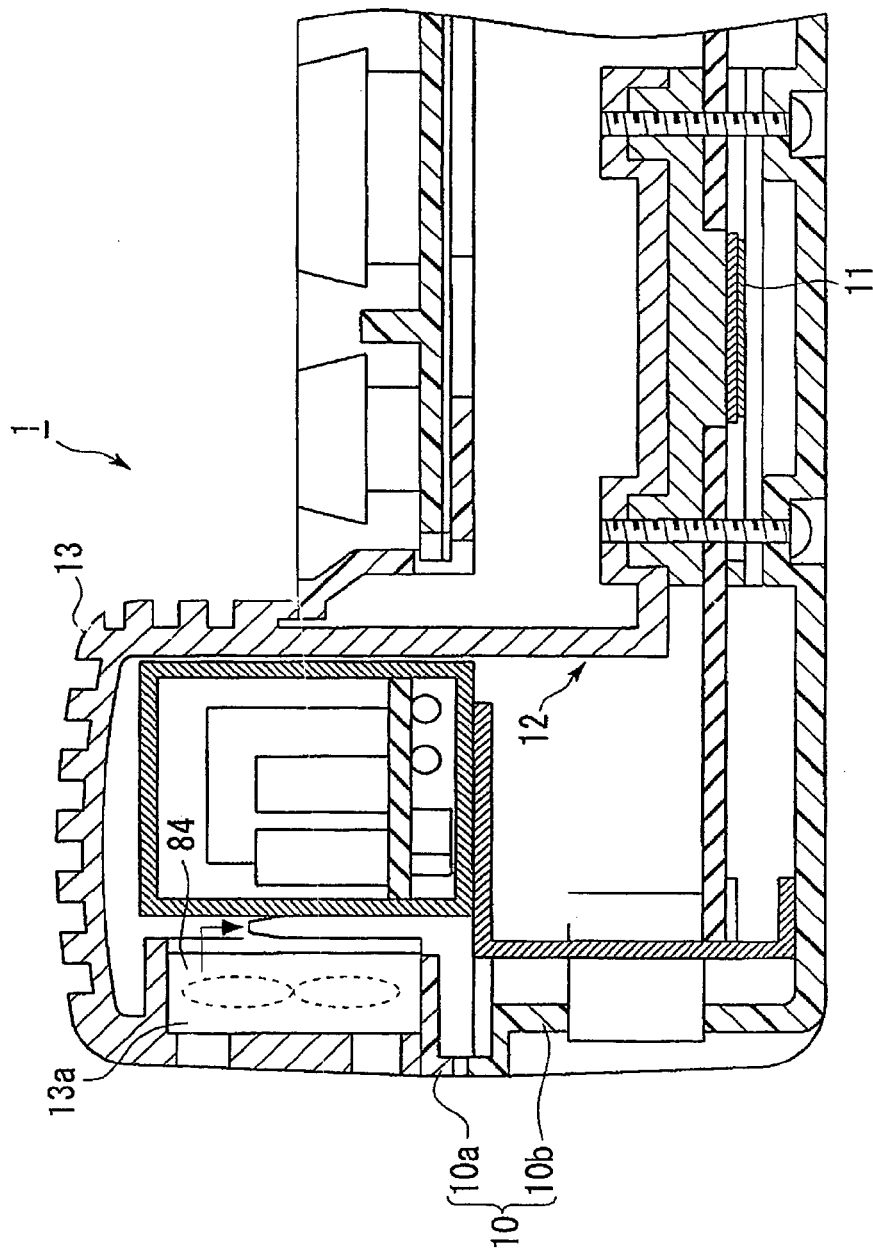
FIG. 18 is a sectional view of a conventional example.
Figure 19:
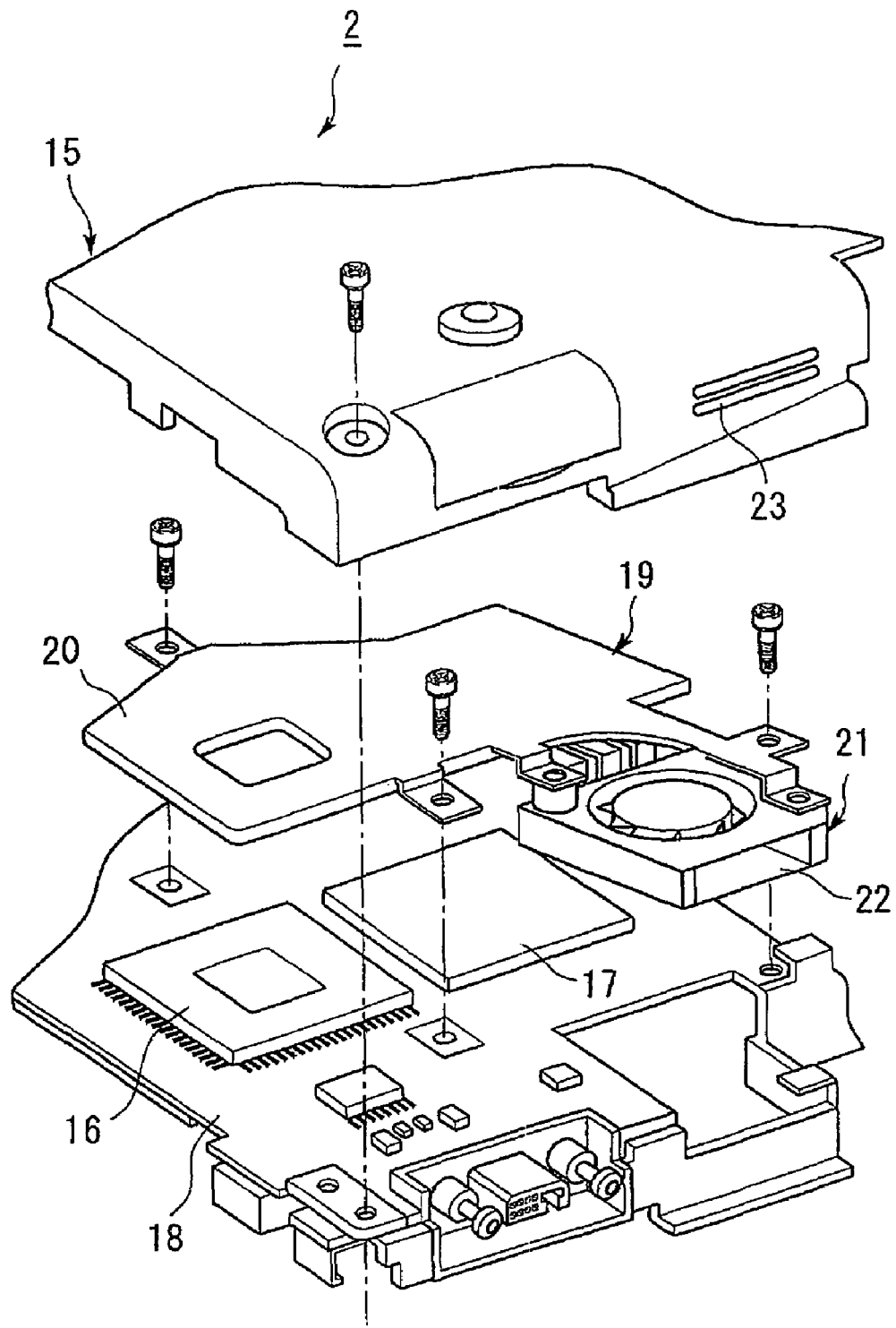
FIG. 19 is an exploded perspective view of another conventional example.
Figure 20:
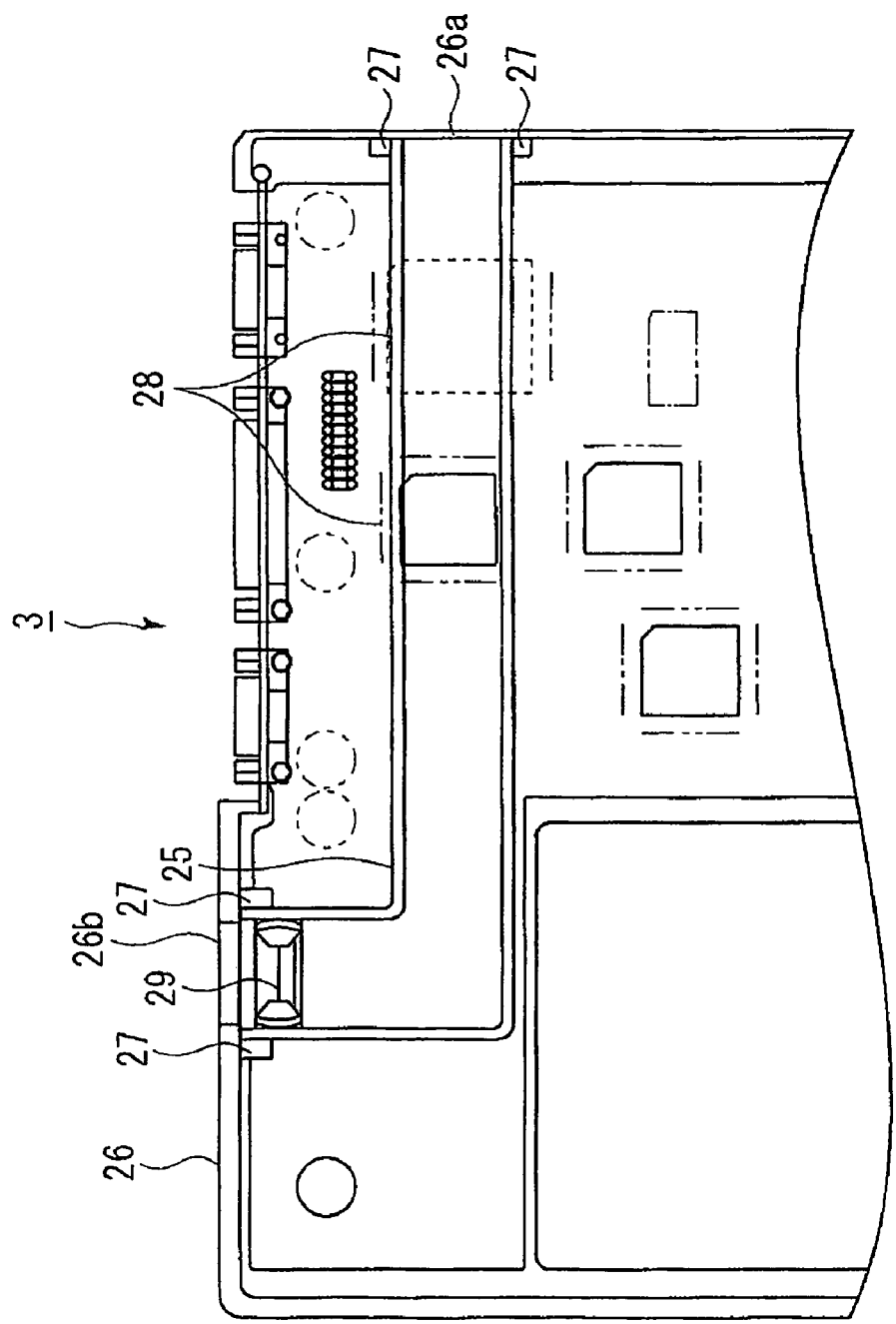
FIG. 20 is a sectional view of another conventional example.
Figure 21:
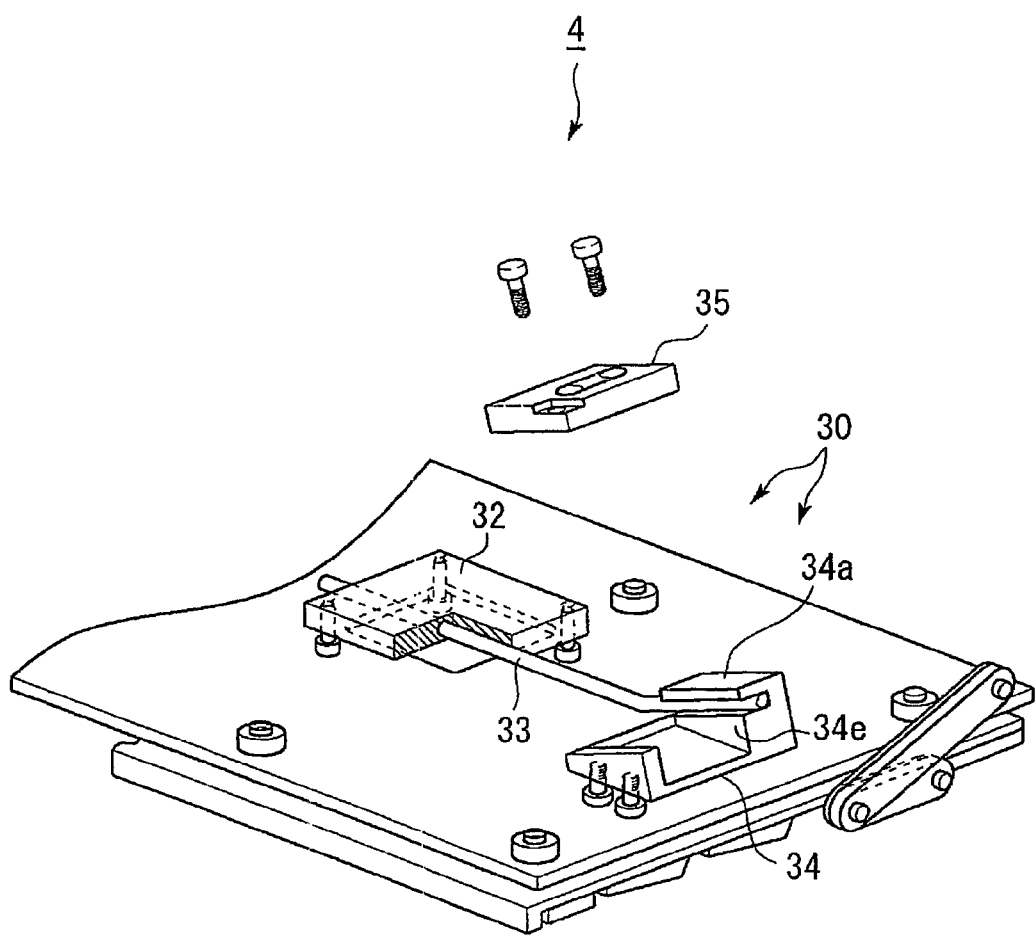
FIG. 21 is a sectional view of another conventional example.

In this case, as shown in FIG. 17, it has been common practice to connect the CPU 94 and the cooling fan 92 through a heat pipe 98. In FIG. 17, reference symbols 98a, 98b indicate mounting blocks.

In this case, however, the mounting portions of the heat pipe 98 are arranged vertically, which leads to a reduction in the heat conductivity of the heat pipe 97, making it impossible to cool the CPU 94 to a sufficient degree.

In contrast, in the present invention, the CPU 67 and the cooling fan 52, which are arranged vertically, are connected by the radiating member 51 formed of a sheet metal member, so that it is possible to prevent a reduction in heat conductivity (see FIG. 10).

While in the above-described embodiment the CPU 67 is cooled by the cooling device 5, the present invention is also applicable to cases in which heat generating electronic components other than a CPU are to be cooled.

INDUSTRIAL APPLICABILITY

The present invention is applicable to various types of electronic equipment, such as a computer.

What is claimed is:

1. A cooling device for cooling electronic components mounted on top and bottom surfaces of a substrate, comprising:
    a radiating member having a generally U-shaped cross section and including a pair of mounting plates formed of a heat conductive sheet metal member which are positioned in parallel with each other and a connection plate for connecting the pair of mounting plates to each other; and
    a cooling fan mounted on one of the mounting plates of the radiating member, wherein the other one of the mounting plates of the radiating member is in a pressure contact with one of the electronic components mounted on the substrate, in which state the cooling part is attached to the substrate, and wherein the pair of mounting plates of the radiating member are so disposed as to sandwich the electronic components mounted on the top and bottom surfaces of the substrate.

2. A cooling device according to claim 1, wherein the cooling fan is mounted on an outer surface of the mounting plate, and
    wherein the mounting plate on which the cooling fan is mounted is provided with an opening communicating with an intake port of the cooling fan.

3. A cooling device according to claim 1, wherein the pair of mounting plates are arranged in alignment with each other.

4. A substrate having electronic components mounted on a top and a bottom surface thereof, comprising:
    a radiating member having a generally U-shaped cross section and including a pair of mounting plates formed of a heat conductive sheet metal member which are positioned in parallel with each other and a connection plate for connecting the pair of mounting plates to each other; and
    a cooling fan mounted on one of the mounting plates of the radiating member, wherein the other one of the pair of mounting plates of the radiating member is in a pressure contact with one of the electronic components,
    the connection plate is situated outside the region of the substrate,
    the cooling fan mounted on the one of the mounting plates is disposed on a side of the substrate opposite that of the one of the electronic components, and
    the pair of mounting plates of the radiating member are so disposed as to sandwich the electronic components mounted on the top and bottom surfaces of the substrate.

5. A substrate according to claim 4, wherein a gap is provided between the mounting plate on which the cooling fan is mounted and the substrate.

6. A substrate according to claim 5, wherein an electronic component is mounted in the gap.

7. A substrate according to claim 4, wherein the pair of mounting plates of the radiating member are arranged in alignment with each other, and wherein the cooling fan is arranged at a position opposed to the electronic components.

8. An electronic equipment including a substrate having electronic components mounted on a top and a bottom surface thereof, comprising:
- a radiating member having a substantially U-shaped cross section and including a pair of mounting plates formed of a heat conductive sheet metal member which are positioned in parallel with each other and a connection plate for connecting the pair of mounting plates to each other; and
- a cooling fan mounted on one of the mounting plates of the radiating member, wherein the other one of the pair of mounting plates of the radiating member is in a pressure contact with one of the electronic components,
- the pair of mounting plates of the radiating member are so disposed as to sandwich the electronic components mounted on the top and bottom surfaces of the substrate,
- the connection plate is situated outside the region of the substrate, and
- the cooling fan mounted on the one of the mounting plates is disposed on a side of the substrate opposite that of the one of the electronic components.

9. An electronic equipment according to claim 8, wherein a gap is provided between the mounting plate on which the cooling fan is mounted and the substrate.

10. An electronic equipment according to claim 9, wherein an electronic component is mounted in the gap.

11. An electronic equipment according to claim 8, wherein the pair of mounting plates of the radiating member are arranged in alignment with each other, and wherein the cooling fan is arranged at a position opposed to the electronic components.

12. The cooling device according to claim 1, wherein the one of the mounting plates comprises an intake port communicating with the cooling fan.

13. The cooling device according to claim 1, wherein the cooling fan comprises an exhaust port for discharging air.

14. The cooling device according to claim 1, wherein the one of the electronic components is contacted in pressure with the other one of the mounting plates via one selected from a group of consisting of a radiation rubber and a filler material.

15. The substrate according to claim 4, wherein the one of the mounting plates comprises an intake port communicating with the cooling fan.

16. The substrate according to claim 4, wherein the cooling fan comprises an exhaust port for discharging air.

17. The substrate according to claim 4, wherein the one of the electronic components is contacted in pressure with the other one of the pair of mounting plates via one selected from a group of consisting of a radiation rubber and a filler material.

18. The electronic equipment according to claim 8, wherein the one of the mounting plates comprises an intake port communicating with the cooling fan.

19. The electronic equipment according to claim 8, wherein the cooling fan comprises an exhaust port for discharging air.

20. The electronic equipment according to claim 8, wherein the other one of the pair of the electronic components is contacted in pressure with the other one of the mounting plates via one selected from a group of consisting of a radiation rubber and a filler material.

* * * * *